(12) United States Patent
Block et al.

(10) Patent No.: US 8,502,536 B2
(45) Date of Patent: Aug. 6, 2013

(54) METHOD FOR ACCELERATED HIGH RESOLUTION CHEMICAL SPECIES SEPARATION FOR MAGNETIC RESONANCE IMAGING

(75) Inventors: Walter Francis Block, Madison, WI (US); Catherine Judith Moran, Palo Alto, CA (US); Scott Brian Reeder, Middleton, WI (US); Ethan K Brodsky, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 348 days.

(21) Appl. No.: 13/082,847

(22) Filed: Apr. 8, 2011

(65) Prior Publication Data
US 2012/0256625 A1      Oct. 11, 2012

(51) Int. Cl.
*G01V 3/00* (2006.01)

(52) U.S. Cl.
USPC .......................................... 324/309; 324/307

(58) Field of Classification Search
USPC .......................... 324/300–322; 600/407–445
See application file for complete search history.

(56) References Cited

U.S. PATENT DOCUMENTS

| | | | | |
|---|---|---|---|---|
| 6,043,654 | A  * | 3/2000 | Liu et al. | 324/309 |
| 6,856,134 | B1 * | 2/2005 | Reeder et al. | 324/309 |
| 7,253,620 | B1 * | 8/2007 | Derbyshire et al. | 324/307 |
| 7,683,614 | B2 * | 3/2010 | Posse | 324/307 |
| 7,777,488 | B2 * | 8/2010 | Gore et al. | 324/309 |
| 7,880,466 | B2 * | 2/2011 | Derbyshire et al. | 324/307 |
| 2012/0313641 | A1 * | 12/2012 | Labadie et al. | 324/309 |

OTHER PUBLICATIONS

Brodsky et al., Water-Fat Separation at 3T with IDEAL and 3DPR, University of Wisconsin, Madison WI & GE Healthcare, Menlo Park CA, 2006, 1 page.

Brodsky et al., VIPR IDEAL Vascular Imaging, 2006 Abstract, 1 page.

* cited by examiner

*Primary Examiner* — Brij Shrivastav

(74) *Attorney, Agent, or Firm* — Quarles & Brady, LLP

(57) ABSTRACT

A method for producing an image of a subject with a magnetic resonance imaging (MRI) system is provided. Image data is acquired at a sequence of multiple echo times occurring within two or more repetition times (TRs). Odd-numbered echoes are sampled during odd-numbered TRs, and even-numbered echoes are sampled during even-numbered TRs. Images are reconstructed and used to calculate the respective signal contributions of two or more chemical species using, for example, an IDEAL separation technique. The respective signal contributions are then used to produce images that depicts substantially only one of the chemical species. For example, separated water and fat images may be produced.

18 Claims, 4 Drawing Sheets

METHOD FOR ACCELERATED HIGH RESOLUTION CHEMICAL SPECIES SEPARATION FOR MAGNETIC RESONANCE IMAGING

STATEMENT REGARDING FEDERALLY SPONSORED RESEARCH

This invention was made with government support under CA116380 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for separating the signal contributions of two or more chemical species, such as water and fat, in MR images.

Iterative decomposition of water and fat with echo asymmetry and least squares estimation ("IDEAL") is a multi-echo chemical species separation technique that has been shown to effectively separate water and fat with a number of different acquisitions. As described, for example, in U.S. Pat. No. 6,856,134, the IDEAL method employs a pulse sequence that acquires image data by sampling echo signals that occur at different echo times in a single repetition time ("TR") period. An iterative, linear least squares approach, is used to estimate the separate water and fat signal components in images reconstructed from the acquired image data.

The IDEAL method was developed to address some of the limitations of conventional chemical species separation techniques, commonly termed Dixon methods, that exploit differences in resonance frequencies between chemical species. In particular, conventional Dixon methods require specific echo spacing, which can be difficult to reconcile with other timing requirements, such as a desired short pulse sequence TR. IDEAL allows for much greater flexibility in echo spacing and, thus, is more accommodating to the timing requirements of various sequences; however, IDEAL requires redundant sampling, which limits the spatial resolution achievable in a set scan time.

Previous attempts at improving the spatial resolution achievable with IDEAL have been generally unsatisfactory. For example, attempts have been made to use a balanced steady-state free precession ("bSSFP") pulse sequence that samples multiple half-echoes along radial k-space trajectories; however, the spatial resolution achievable with this method was limited.

It would therefore be desirable to provide an imaging method in which high spatial resolution images can be acquired and used with chemical species separation techniques, such as IDEAL, to produce decomposed signals representative of the individual chemical species. For example, such a method would be beneficial for water-fat separation, in which high spatial resolution water and fat images could be produced.

SUMMARY OF THE INVENTION

The present invention overcomes the aforementioned drawbacks by providing a method for producing a high-resolution image of a subject with a magnetic resonance imaging ("MRI") system, the image depicting signal contributions from substantially only one chemical species. Image data is acquired at a sequence of multiple echo times occurring within two or more repetition times (TRs). Odd-numbered echoes are sampled during odd-numbered TRs, and even-numbered echoes are sampled during even-numbered TRs. Images are reconstructed and used to calculate the respective signal contributions of two or more chemical species using, for example, an IDEAL separation technique. The respective signal contributions are then used to produce images that depict primarily only one of the chemical species. For example, separated water and fat images may be produced.

It is an aspect of the invention to provide a method for producing an image of a subject with an MRI system. A plurality of image data sets are acquired from the subject by sampling k-space along radial trajectories at a corresponding plurality of echo times that occur during a plurality of repetition time periods. Odd-numbered ones of the plurality of image data sets are acquired at odd-numbered ones of the corresponding plurality of echo times occurring during odd-numbered ones of the plurality of repetition time periods. Likewise, even-numbered ones of the plurality of image data sets are acquired at even-numbered ones of the corresponding plurality of echo times occurring during even-numbered ones of the plurality of repetition time periods. From the plurality of acquired image data sets, a plurality of images depicting the subject are reconstructed. Using these reconstructed images, the respective signal contributions from two or more chemical species, such as water and fat, are calculated. For example, chemical shift based water-fat separation technique, such as IDEAL, may be used to calculate these respective signal contributions. An image that depicts signal contributions from substantially only one of the chemical species is then produced using the calculated respective signal contribution.

It is another aspect of the invention to provide a method for producing an image of a subject with an MRI system. First image data is acquired at a first echo time in a first repetition time by sampling k-space at a first radial pattern, and second image data is acquired at a second echo time in a second repetition time by sampling k-space at a second radial sampling pattern. First and second images are reconstructed from the first and second image data, respectively. Using these first and second images, the respective signal contributions from two or more chemical species are calculated. Then, an image of at least one of the chemical species is produced using the calculated respective signal contribution. This produced image depicts signal contributions from substantially only one of the chemical species.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
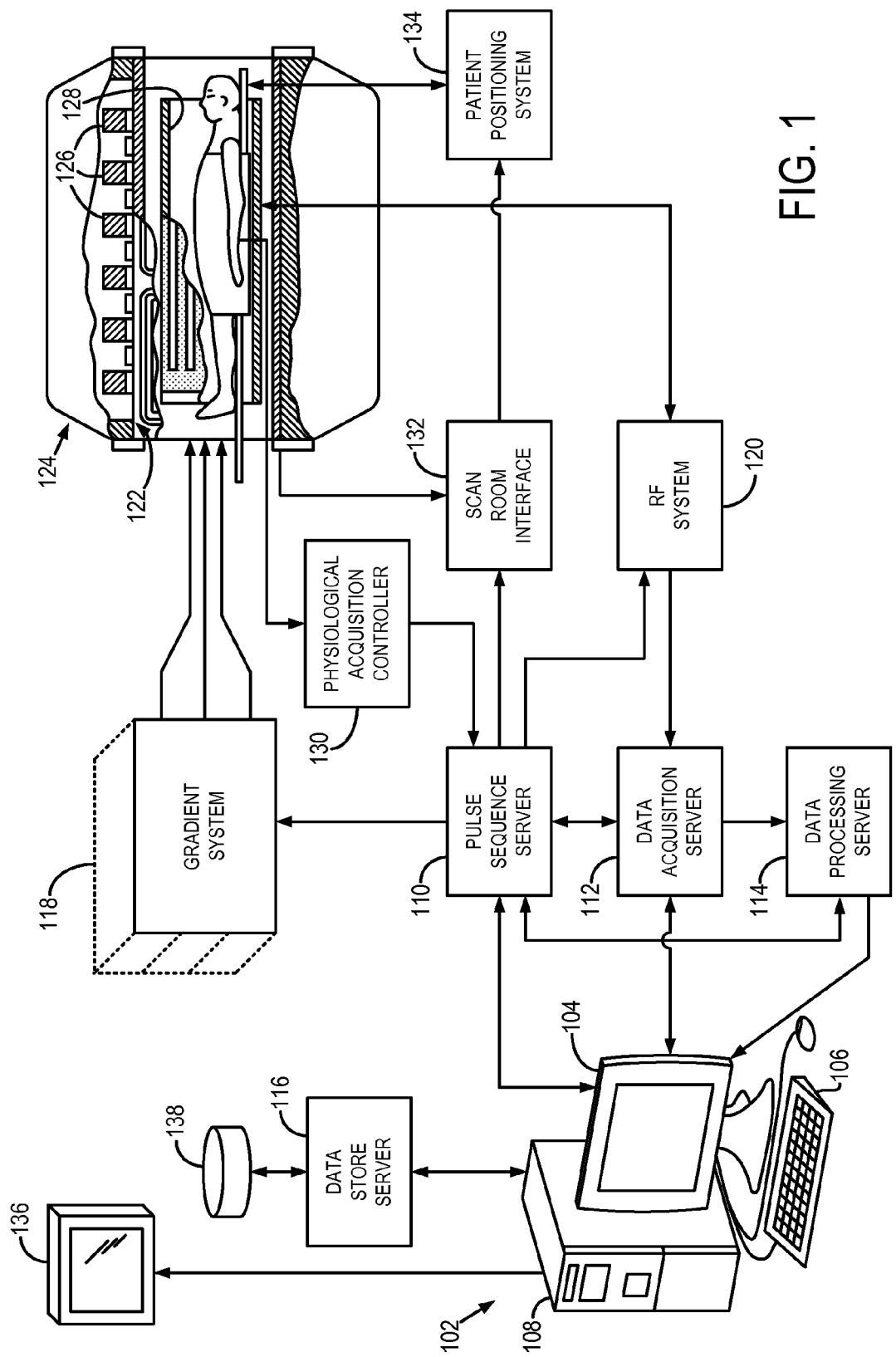
FIG. 1 is a block diagram of an exemplary magnetic resonance imaging ("MRI") system that employs the present invention.

Referring particularly now to FIG. 1, an exemplary magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad (1);$$

and the phase of the received MR signal may also be determined:

$$\varphi = \tan^{-1}\left(\frac{Q}{I}\right). \quad (2)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

In water-fat separation techniques that utilize iterative decomposition of water and fat with echo asymmetry and least squares estimation ("IDEAL") processing, the signal within each voxel is decomposed into separate chemical species through an iterative least squares fitting. The real and imaginary components of each chemical species are unknown along with the phase due to $B_0$ inhomogeneities.

With a known chemical shift between the species of interest, such as water and fat, the signal equations for a series of echo times provide a linear system of equations that can be solved to obtain the decomposed signal components corresponding to the chemical species. An exemplary IDEAL algorithm is described, for example, in U.S. Pat. No. 6,856,134.

The noise efficiency of multi-echo water-fat separation techniques is generally dependent on the water-to-fat ratio within a voxel, and is not always directly proportional to the number of source images utilized for the decomposition. A measure of the noise efficiency of water-fat separation techniques, termed the effective number of signal averages ("NSA") is given by:

$$NSA(\hat{\rho}) = \frac{\sigma_s^2}{\sigma_{\hat{\rho}}^2}; \quad (3)$$

where $\sigma_s^2$ is the variance of noise in a source image and $\sigma^2$ is an estimate of the noise variance in the estimated water or fat image. The maximum available NSA is equal to the number of echo times, at which point the noise efficiency is equal to that achieved by taking the average of the source images from the individual echo times and assuming all fat or all water signal.

By acquiring image data from four different echoes, the range of echo spacings for which high NSA performance is available can be expanded. While the choice of echo spacing is somewhat relaxed due to the increased flexibility garnered from an increasingly overdetermined system, an additional factor must be considered when choosing echo times for a balanced steady-state free precession ("bSSFP") acquisition. The characteristic banding artifacts in bSSFP are due to signal that occur at intervals of 1/TR in the frequency response spectrum. As the location of these nulls varies with the TR, their location and appearance will also vary if the echo locations necessitate a change in TR. With a center frequency on the water resonance, π phase cycling places water at the center of a pass band with the nearest nulls located 1/(2·TR) to either side. Thus, the choice of TR determines the proximity of the nulls to the fat resonance peak in the spectrum. As the location of the fat resonance peak approaches the bSSFP nulls, the level of fat signal will decrease significantly and make robust water-fat separation with IDEAL much more difficult. Thus, echo time spacings should be appropriately selected to maintain high NSA performance while providing substantially optimal placement of nulls in the frequency response spectrum.

Though one of the advantages of IDEAL in comparison to conventional Dixon methods is the ability to decrease echo spacing, the shorter echo times also limit the amount of time available between consecutive echoes for signal encoding. To increase the amount of time available for signal encoding in IDEAL, a dual-pass acquisition capable of sampling k-space in three dimensions with sub-millimeter spatial resolution is provided. In this acquisition, the first and third echo times are acquired in the first pass, and the second and fourth echo times are acquired in the second pass. This acquisition scheme doubles the time available for spatial encoding in comparison to those methods where data is acquired at consecutive echo times.

Figure 2:
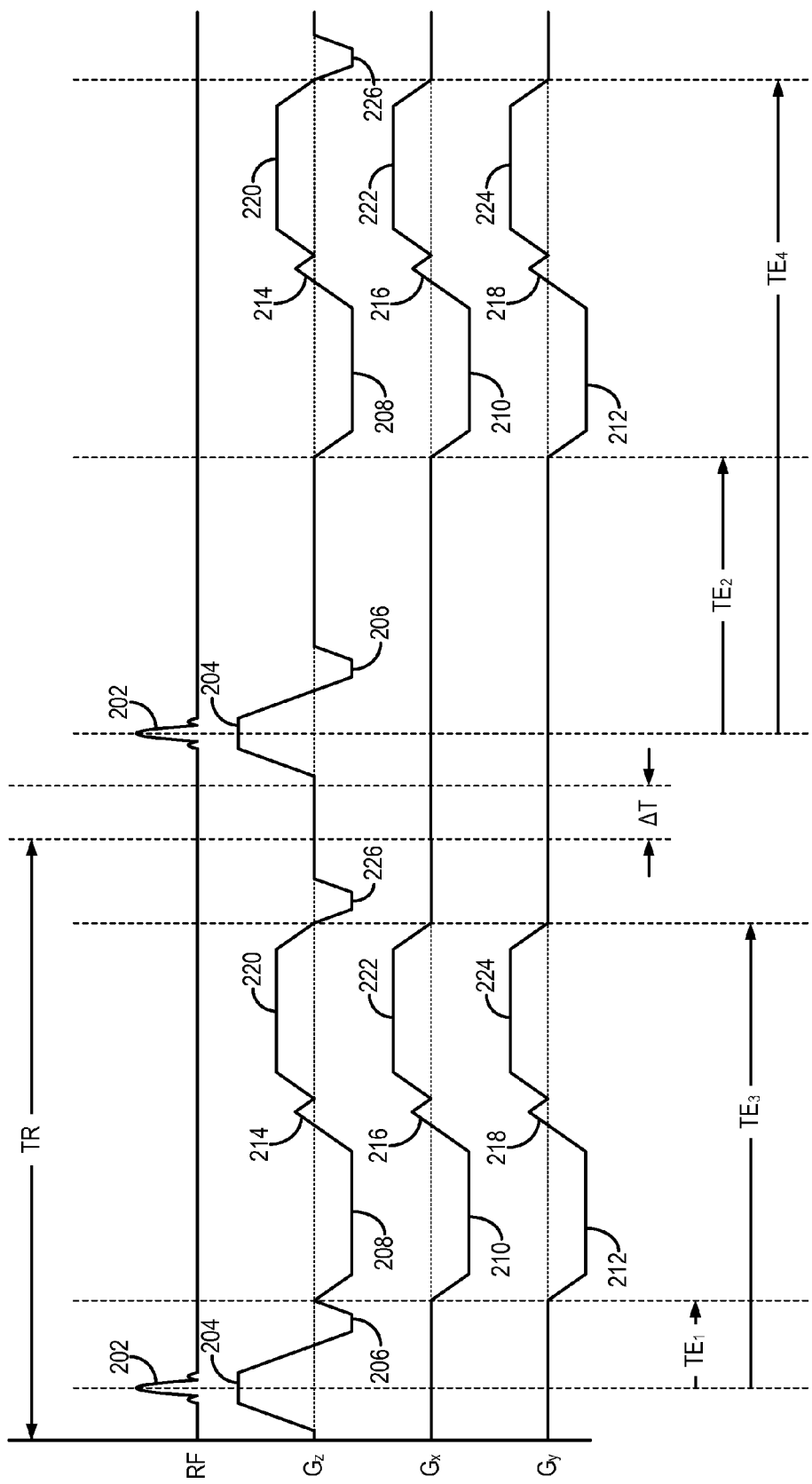
FIG. 2 is a graphic illustration of an exemplary pulse sequence for acquiring image data in accordance with embodiments of the present invention.

Referring now to FIG. 2, an exemplary dual-pass, three-dimensional projection acquisition ("3DPR") bSSFP pulse sequence for acquiring image data from which high resolution images can be produced is illustrated. The pulse sequence is said to be dual-pass because k-space is sampled at different echo times in successively alternating repetitions of the pulse sequence. To illustrate this aspect of the pulse sequence, the first two such repetition time ("TR") periods are shown. In the first TR period, k-space is sampled at a first echo time, $TE_1$, and a third echo time, $TE_3$, and in the second TR period, k-space is sampled at a second echo time, $TE_2$, and a fourth echo time, $TE_4$. These two TR periods are then repeated in this alternating manner to acquire the desired amount of k-space data. Generally, the echo times are selected so that $TE_1 < TE_2 < TE_3 < TE_4$. By way of example, for acquisitions using a 1.5 Tesla MRI system, $TE_1$ may equal 0.3 ms, $TE_2$ may equal 1.5 ms, $TE_3$ may equal 2.9 ms, and $TE_4$ may equal 4.0 ms. These exemplary echo times provide satisfactorily high NSA performance while providing substantially optimal placement of the nulls in the frequency response spectrum.

Between the first and second TR periods a total of four image data sets are acquired: two from the first TR period and two from the second TR period. Specifically, one image data set is acquired from those echo signals produced at the first echo time, $TE_1$, in the first TR period; one image data set is acquired from those echo signals produced at the second echo time, $TE_2$, in the second TR period; one image data set is acquired from those echo signals produced at the third echo time, $TE_3$, in the first TR period; and one image data set is acquired from those echo signals produced at the fourth echo time, $TE_4$, in the second TR period. During an imaging scan, of course, the pulse sequence is repeated many times and the radial readout directions are stepped through different k-space directions so as to sample k-space throughout a three-dimensional volume.

The exemplary pulse sequence begins with the production of a radio frequency ("RF") excitation pulse 202 in the presence of a slab-selective gradient pulse 204, which excites spins throughout a three-dimensional volume-of-interest defined by the slab-selective gradient pulse 204. The slab-selective gradient pulse 204 is followed by a rephasing gradient lobe 206 that rephases the spins excited by the RF excitation pulse 202. Three readout gradients 208, 210, 212 are played out along the three respective gradient axes, $G_z$, $G_x$, and $G_y$, in order to sample k-space and acquire image data from the transverse magnetization produced by the excited spins in the volume-of-interest at the first echo time in the TR period, such as $TE_1$ for the first, or subsequent odd-numbered, TR period and $TE_2$ for the second, or subsequent even-numbered, TR period. The readout gradients 208, 210, 212 produce an echo signal, such as a half echo signal from which image data is sampled. The image data may be acquired during the duration of the readout gradients 208, 210, 212, including the ramp-up and ramp-down portions of these gradients 208, 210, 212. This data acquisition technique promotes efficiency and allows for shorter TR periods to be utilized.

The readout gradients 208, 210, 212 are followed by three rotation gradient blips 214, 216, 218 that are played out along the $G_z$, $G_x$, and $G_y$ gradient axes, respectively. These gradient blips 214, 216, 218 shift the sampling of k-space to a different radial trajectory. A second set of readout gradients 220, 222, 224 are then played out along the $G_z$, $G_x$, and $G_y$ gradient axes, respectively, in order to sample k-space at the second echo time in the TR period, such as $TE_3$ for the first, or subsequent odd-numbered, TR period and $TE_4$ for the second, or subsequent even-numbered, TR period.

To maintain the steady-state condition, the integrals along the three gradient axes each sum to zero during each TR period. To accomplish this, a dephasing gradient 226 is played out along the slice-select gradient axis, such as the $G_z$-axis as illustrated in FIG. 2. This dephasing gradient 218 is played out prior to the repetition of the slab-selective gradient 204 in the next TR period. The pulse sequence is then repeated for a second TR period, in which the onset of the readout gradients 208, 210, 212 and subsequent gradients is delayed so that the readout gradients 208, 210, 212 sample k-space at the echo time $TE_2$ and the second readout gradients 220, 222, 224 sample k-space as the echo time $TE_4$. As is well known in the art, both the first and second TR periods of the pulse sequence may be repeated with appropriate changes to the readout gradients to sample k-space in a desired volume-of-interest. Despite the different echo times and the possibility of shortening the first TR period, the TR may be kept constant for both sets of echoes with a delay, $\Delta T$, added at the end of the first TR period and at the beginning of the second TR period to accommodate the echo spacing. The addition of the delay, $\Delta T$, to produce a constant TR also assures that the magnitude profile of each bSSFP response spectrum is substantially equal.

Figure 3A:
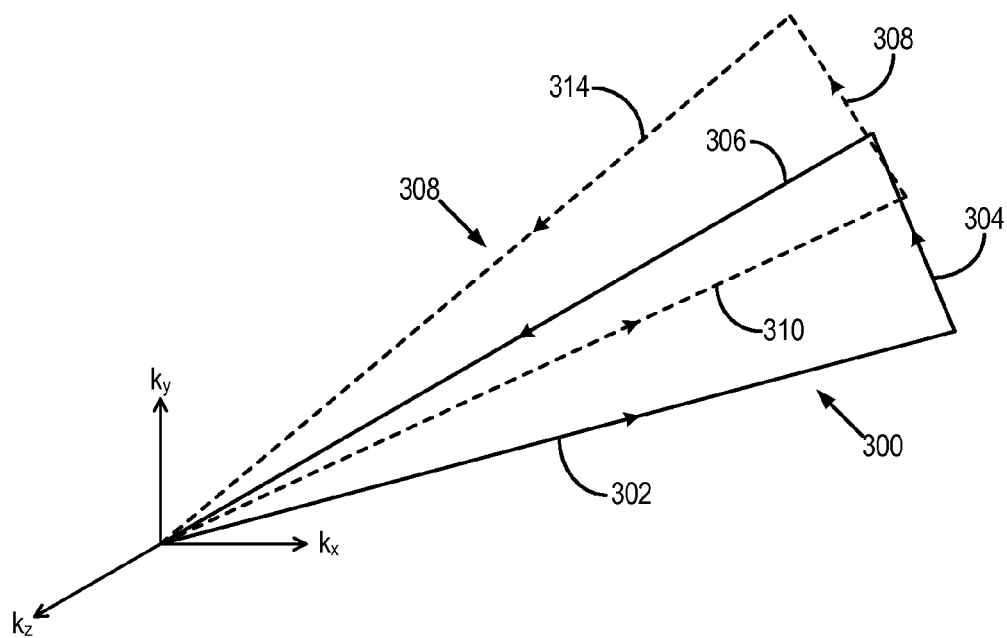
FIG. 3A is a graphic illustration of exemplary k-space trajectories traversed during odd and even repetition time ("TR") periods of the pulse sequence of FIG. 2.
Figure 3B:
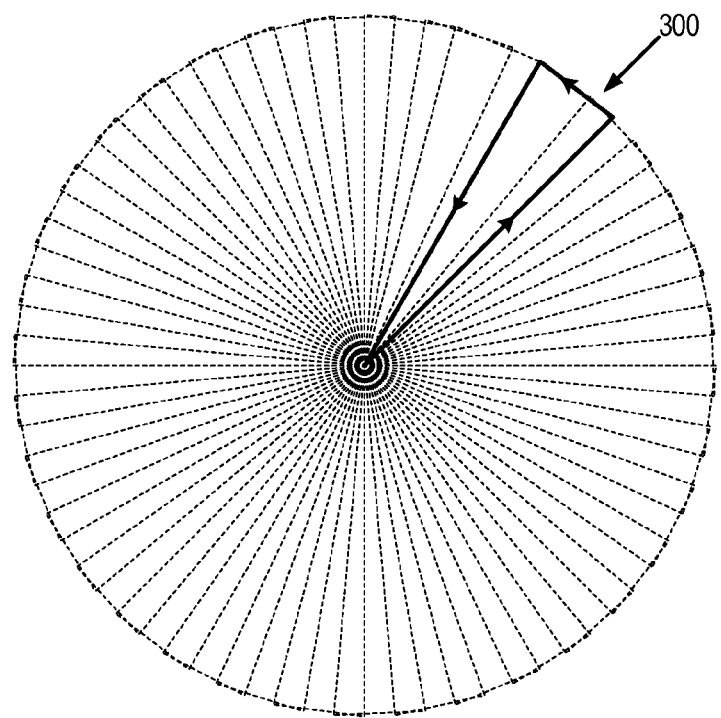
FIG. 3B is a graphic illustration of multiple k-space trajectories that traverse a volume-of-interest by repeating the pulse sequence of FIG. 2 a plurality of times.

Using the aforementioned pulse sequence, k-space may be sampled with a trajectory that includes a set of four interleaved radial lines, with each radial line being acquired at a different one of the echo times $TE_1$, $TE_2$, $TE_3$, and $TE_4$. Thus, the pulse sequence illustrated in FIG. 2 may be configured to sample k-space along the trajectories shown in FIG. 3A. The first k-space trajectory 300 includes a first radial portion 302 that is produced by the application of the readout gradients 208, 210, 212, during which the echo signal produced at the echo time $TE_1$ is sampled. The rotation gradient blips 214, 216, 218 then result in the shift 304 in the k-space trajectory. The application of the second readout gradients 220, 222, 224 produces the second radial portion 306, during which the echo signal produced at the echo time $TE_3$ is sampled. During the second TR period, the second k-space trajectory 308 is traversed. In the second k-space trajectory 303, the amplitudes of the readout gradients 208, 210, 212 are altered so that k-space is sampled along a third radial portion 310 that is different than the first radial portion 302. This third radial portion 310 is traversed while sampling the echo signal produced at the echo time $TE_2$. The application of rotation gradient blips 214, 216, 218 then result in the shift 312 of the k-space trajectory. An echo signal produced at the echo time $TE_4$ is then sampled by the application of the second readout gradients 220, 222, 224, whose amplitudes may be changed so that a fourth radial portion 314 that is different than the second radial portion 306 is traversed. The amplitudes of the readout gradients may be altered during each repetition of the first and second TR periods of the pulse sequence so that a volume-of-interest in k-space is sampled, as illustrated in FIG. 3B.

In some embodiments, the same radial trajectories may be sampled at each echo time. For example, the same radial portion may be sampled at each echo time before the next radial portion is selected for sampling. When the same radial lines are sampled at each echo time, streak artifacts in the resultant images are decomposed into their respective chemical species. For example, streak artifacts occurring because of water signal will only appear in a decomposed water image, whereas streak artifacts occurring because of fat signal will only appear in a decomposed fat image.

On the other hand, when a unique set of radial lines is sampled at each echo time, the streak artifacts are not resolved into one species or the other and appear in both decomposed images. In these instances, the artifacts are less coherent and reflective of the increased total number of radial lines acquired in the trajectory.

In the case of water-fat separation, this difference in manifestation of the streak artifacts within the object appears to be reasonable because the progression of phase indicating a fat component varies spatially when unique radial lines are sampled. Therefore, the decomposition is likely to have difficulty correctly identifying the component of the signal that is due to the artifact. Although the IDEAL algorithm does not remove the streak artifacts, the artifact signal is not strong enough to interfere with the effective decomposition of the non-artifact object signal.

The IDEAL algorithm effectively corrects each source image for $B_0$ field map inhomogeneities before decomposing the signal into water and fat channels. In the water channel, the IDEAL decomposition sums water signal from each of the source images that have been corrected for $B_0$ inhomogeneities. Because combining the water signal is a linear operation, undersampling artifacts from water in each of the source images destructively interfere in the water image calculated by IDEAL. It is contemplated, on the other hand, that undersampling artifacts from fat signal in each of the source images will only partially interfere in the water image calculated by IDEAL because there is a phase shift in the fat signal due to the different acquisition times. Thus, while the artifact from water is reduced, some undersampling artifacts from the fat signal are expected to remain in the water channel. However, it has been discovered that the level of remaining fat artifact in the water channel is less than the level of water artifact that would remain if the same set of radial lines were sampled at each echo time.

Figure 4:
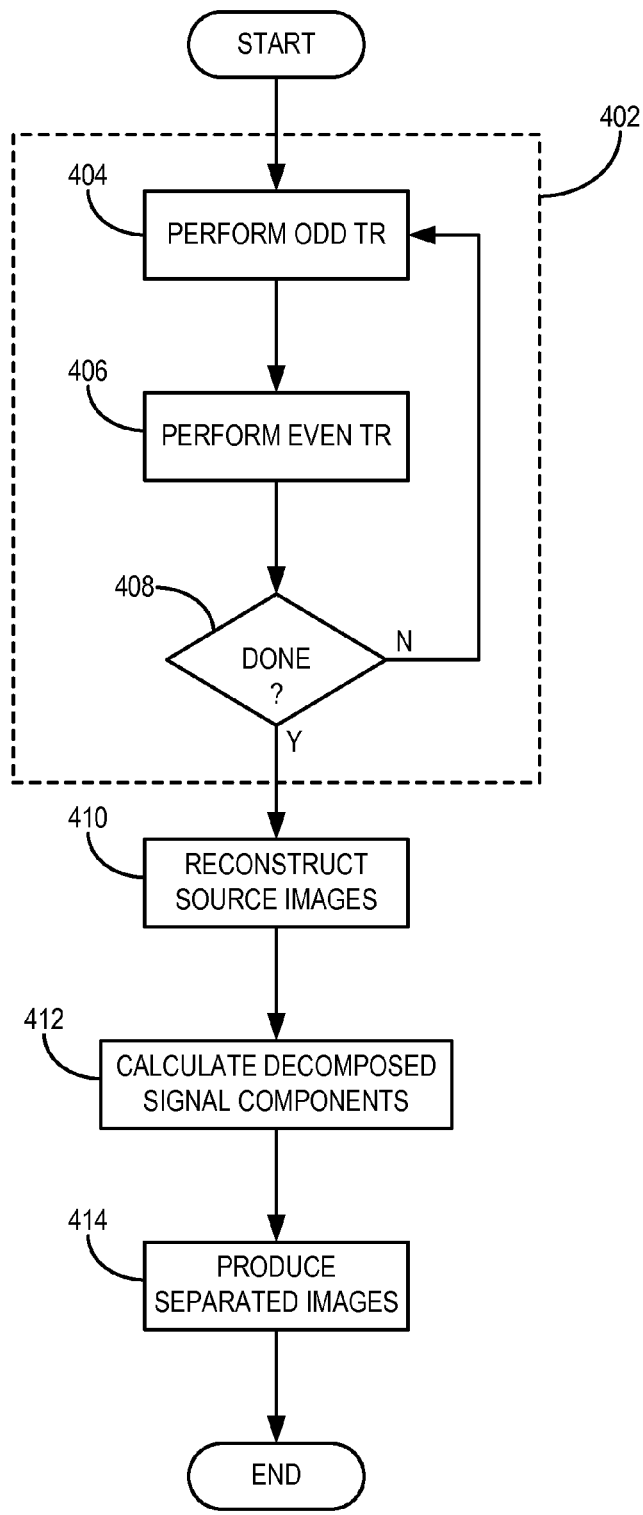
FIG. 4 is a flowchart setting forth the steps of an exemplary method for data acquisition, image reconstruction, and chemical species separation in accordance with embodiments of the invention.

Referring now to FIG. 4, an exemplary method for data acquisition, image reconstruction, and chemical species separation in accordance with embodiments of the invention is illustrated. The exemplary method begins with the acquisition of image data, as indicated generally at processes 402. The data acquisition includes performing a pulse sequence, such as the one illustrated in FIG. 2, to acquire image data from multiple echo signals in an odd-numbered TR period, as indicated at step 404, and then to acquire image data from multiple echo signals in an even-numbered TR period, as indicated at step 406. These odd-numbered and even-numbered TR periods are sequentially performed a plurality of times in order to acquire the desired image data. Once all of the desired image data has been acquired, as determined at decision block 408, the data acquisition is complete. From the acquired image data, source images are reconstructed, as indicated at step 410. These source images are then used to calculate the decomposed signal components of the desired chemical species, as indicated at step 412. This calculation is performed, for example, with an IDEAL technique. Exemplary chemical species are water and fat; however, it will be appreciated by those skilled in the art that the signal contributions of other chemical species may be decomposed as well. The calculated decomposed signal components are then used to produce images of the separated signal contributions for the desired chemical species, as indicated at step 414.

Thus, the provided imaging method provides superior separation of water and fat signals while allowing the acquisition of high resolution image data sets. Additionally, the provided imaging method provides for effective water-fat separation despite sampling a unique set of radial lines at each echo time.

It should be appreciated that the dual-pass data acquisition technique described above, in which echoes occurring at odd-numbered TEs are acquired in odd-numbered TR periods and echoes occurring at even-numbered TEs are acquired in even-numbered TR periods, can be implemented in pulse sequences other than the 3DPR bSSFP pulse sequence illustrated in FIG. 2. For example, the dual-pass technique may be implemented in other pulse sequences, such as fast spin echo ("FSE") pulse sequences and spoiled gradient ("SPGR") pulse sequences. In addition, the dual-pass technique may be implemented using sampling trajectories other than radial trajectories. For example, rectilinear, or Cartesian, trajectories and spiral trajectories may be used.

It should further be appreciated that, while the foregoing discussion made reference to the separation of water and fat signals, that the provided method can be readily adapted to provide accurate separation of other chemical species, such as hyperpolarized carbon-13, metabolites containing hyperpolarized carbon-13, hyperpolarized xenon-129, hyperpolarized helium-3, acetone, choline, lactate, and silicone proton NMR signals. For example, the signal from protons in water, fat, and silicone can all be separated accurately in the same imaging application by way of the provided method.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
   a) acquiring from the subject with the MRI system, a plurality of image data sets by sampling k-space along trajectories at a corresponding plurality of echo times that occur during a plurality of repetition time periods, in which odd-numbered ones of the plurality of image data sets are acquired at odd-numbered ones of the corresponding plurality of echo times occurring during odd-numbered ones of the plurality of repetition time periods and even-numbered ones of the plurality of image data sets are acquired at even-numbered ones of the corresponding plurality of echo times occurring during even-numbered ones of the plurality of repetition time periods;
   b) reconstructing from the plurality of image data sets acquired in step a), a plurality of images depicting the subject;
   c) calculating respective signal contributions from at least two chemical species using the plurality of images reconstructed in step b); and
   d) producing an image that depicts signal contributions from substantially only one of the at least two chemical species using the respective signal contribution calculated in step c).

2. The method as recited in claim 1 in which the at least two chemical species include at least two of water, fat, silicone, hyperpolarized carbon-13, metabolites containing hyperpolarized carbon-13, hyperpolarized xenon-129, hyperpolarized helium-3, acetone, choline, and lactate.

3. The method as recited in claim 1 in which each successive one of the corresponding plurality of echo times is greater than a preceding one of the corresponding plurality of echo times, such that a first odd-numbered echo time is shorter than a first even-numbered echo time.

4. The method as recited in claim 1 in which step a) includes sampling k-space along a different radial trajectory at each of the plurality of echo times.

5. The method as recited in claim 4 in which the different radial trajectories at which k-space is sampled in step a) form an interleaved set of radial trajectories.

6. The method as recited in claim 1 in which a delay time is added after each of the odd-numbered ones of the plurality of repetition time periods to improve spacing of the odd-numbered ones of the corresponding plurality of echo times and the even-numbered ones of the corresponding plurality of echo times.

7. The method as recited in claim 1 in which step c) includes solving a system of linear equations that relate the respective signal contributions to the plurality of echo times and signal information contained in the plurality of images reconstructed in step b).

8. The method as recited in claim 7 in which step c) includes solving the system of linear equations by performing an iterative least squares estimation.

9. The method as recited in claim 1 in which the plurality of image data sets are acquired in step a) by sampling k-space along radial trajectories.

10. The method as recited in claim 1 in which the plurality of image data sets are acquired in step a) by sampling k-space along at least one of Cartesian and spiral trajectories.

11. A method for producing an image of a subject with a magnetic resonance imaging (MRI) system, the steps of the method comprising:
   a) acquiring first image data with the MRI system, the first image data being acquired at a first echo time in a first repetition time by sampling k-space at a first sampling pattern;
   b) acquiring second image data with the MRI system, the second image data being acquired at a second echo time in a second repetition time by sampling k-space at a second sampling pattern;
   c) reconstructing first images from the first image data;
   d) reconstructing second images from the second image data;
   e) calculating respective signal contributions from at least two chemical species using the reconstructed first images and the reconstructed second images; and
   f) producing an image of at least one of the at least two chemical species using the calculated respective signal contribution, the produced image depicting signal contributions from substantially only the at least one of the at least two chemical species.

12. The method as recited in claim 11 in which step a) further includes acquiring third image data at a third echo time in the first repetition time by sampling k-space at a third sampling pattern.

13. The method as recited in claim 12 in which step b) further includes acquiring fourth image data at a fourth echo time in the second repetition time by sampling k-space at a fourth sampling pattern.

14. The method as recited in claim 13 in which the first, second, third, and fourth sampling patterns are radial sampling patterns.

15. The method as recited in claim 14 in which the first, second, third, and fourth radial sampling patterns sample different portions of k-space.

16. The method as recited in claim 13 in which the second echo time is greater than the first echo time, the third echo time is greater than the second echo time, and the fourth echo time is greater than the third echo time.

17. The method as recited in claim 13 in which a delay time is added between the first repetition time and the second repetition time to improve spacing of the first and third echo times and the second and fourth echo times.

18. The method as recited in claim 11 in which a delay time is added between the first repetition time and the second repetition time to improve spacing of the first echo time and the second echo time.

* * * * *